(12) United States Patent
Tellez Oliva (10) Patent No.: US 12,227,834 B2
(45) Date of Patent: Feb. 18, 2025

(54) PROCESS AND DEVICE FOR DIAMOND SYNTHESIS BY CVD

(71) Applicant: DIAROTECH, Fleurus (BE)

(72) Inventor: Horacio Tellez Oliva, Charleroi (BE)

(73) Assignee: DIAROTECH, Fleurus (BE)

( * ) Notice: Subject to any disclaimer, the term of this patent is extended or adjusted under 35 U.S.C. 154(b) by 786 days.

(21) Appl. No.: 17/257,766

(22) PCT Filed: Jun. 18, 2019

(86) PCT No.: PCT/EP2019/066079
§ 371 (c)(1),
(2) Date: Apr. 21, 2021

(87) PCT Pub. No.: WO2020/007605
PCT Pub. Date: Jan. 9, 2020

(65) Prior Publication Data
US 2021/0172060 A1   Jun. 10, 2021

(30) Foreign Application Priority Data

Jul. 5, 2018   (BE) .................... 2018/5473

(51) Int. Cl.
| | | |
|---|---|---|
| *C23C 16/27* | (2006.01) | |
| *C23C 16/503* | (2006.01) | |
| *C23C 16/509* | (2006.01) | |
| *C23C 16/517* | (2006.01) | |
| *H01J 37/32* | (2006.01) | |

(52) U.S. Cl.
CPC .......... *C23C 16/272* (2013.01); *C23C 16/503* (2013.01); *C23C 16/509* (2013.01); *C23C 16/517* (2013.01); *H01J 37/32027* (2013.01); *H01J 37/32036* (2013.01); *H01J 37/3244* (2013.01); *H01J 37/3266* (2013.01); *H01J 2237/3321* (2013.01)

(58) Field of Classification Search
CPC ... C23C 16/272; C23C 16/503; C23C 16/509; C23C 16/517; H01J 37/32027; H01J 37/32036; H01J 37/3244; H01J 37/3266; H01J 2237/3321; H01J 37/32091
See application file for complete search history.

(56) References Cited

U.S. PATENT DOCUMENTS

2015/0170902 A1   6/2015   Reynvaan et al.

FOREIGN PATENT DOCUMENTS

| CN | 1103900 A | 6/1995 | |
|---|---|---|---|
| CN | 205556778 U | 9/2016 | |
| JP | S62157602 A | 7/1987 | |
| JP | H06220367 A | 8/1994 | |
| JP | 2004339570 A | 12/2004 | |
| WO | WO-2017121892 A1 * | 7/2017 | ............. C23C 16/27 |

OTHER PUBLICATIONS

Machine translation, WO 2017121892 (Year: 2017).*

* cited by examiner

*Primary Examiner* — Michael G Miller
(74) *Attorney, Agent, or Firm* — Maschoff Brennan (57) ABSTRACT

Synthesis methods for performed by chemical vapor deposition are improved, particularly for diamond synthesis. The time required for depositing diamond layers is reduced by compressing the plasma near the deposition substrate to increase the chances of collision between active species.

20 Claims, 4 Drawing Sheets

PROCESS AND DEVICE FOR DIAMOND SYNTHESIS BY CVD

The invention relates to the synthesis of diamond or any other allotropic form of carbon by chemical vapour deposition.

Carbon is a material with several allotropic forms naturally found in solid state on the Earth, which are amorphous carbon and three crystallised forms, graphite, diamond and lonsdaleite. The diamond is primarily made up of $sp^3$ hybridised carbon atoms, whereas graphite is primarily made up of $sp^2$ hybridised carbon. Other allotropic forms exist in synthetic form, such as the DLC.

Diamond is a material with a unique combination of properties, such as wear resistance, thermal conductivity or electrical insulation, which are very useful for many technical applications. The rarity and the price of natural diamonds make its use impossible on a large scale and limits it to luxury jewelry. However, in recent decades, diamond synthesis methods have been developed, in the hope of facilitating access to this material on a larger scale for technical applications.

DLC or "Diamond Like Carbon" is also a useful material, differing from diamond by a proportion of up to 60% of $sp^2$ hybridised carbon in the $sp^3$ hybridised carbon.

The preferred method for the synthesis of thin layers of diamond or DLC on a substrate is the Chemical Vapour Deposition or CVD at low pressure. According to this method, the diamond is deposited in crystal form on a substrate placed in a chamber into which a carrier gas containing carbon atoms is introduced, which is transformed into plasma by an energy source.

Several technologies can be used for the formation of plasma, such as for example direct current, electric arc, hot filament or microwaves and several others. Currently, the devices that dominate the market use microwaves or a hot filament.

The main disadvantage of these methods is the extremely low speed of diamond deposition. The hot filament technology can form diamond layers of approximately 1 µm in one hour. These layers are also often contaminated by the elements of the filament. Microwaves improve the deposition speed to approximately 45 µm per hour, but technically limit the deposition diameter to approximately 16 mm due to the wavelength. Therefore, it takes significant reaction times to form extremely thin layers of diamond, due to which it becomes impossible to develop these methods industrially in terms of energy cost, efficiency of the occupation time of the equipment and hence the production cost. These limitations of existing methods are given in detail by A. Tallaire in C. R. *Physique* 14 (2013) 169-184. The diamonds produced synthetically in thin layers therefore, for the time being, remain limited to applications in the field of mining or oil drilling.

In order to make the diamond technically and economically accessible for many technical applications, it was deemed necessary by the applicant to propose a method of diamond synthesis that will improve the speed of deposition. This is the problem that led to the invention of this application.

For this purpose, the invention firstly relates to a process of diamond synthesis, in a vapour deposition chamber and on a synthesis substrate, between two plasma-generating electrodes, according to which:
 a carrier gas containing carbon atoms is introduced into the chamber and
 a plasma is created near the substrate to generate reactive carbon atoms, a process characterised in that the plasma is compressed to increase the volume density of reactive carbon atoms near the substrate and therefore the deposition speed.

The invention also relates to a process of diamond synthesis in a vapour deposition chamber (1) and on a synthesis substrate (5), between two plasma-generating electrodes (4, 5), according to which:
 a carrier gas containing carbon atoms is introduced into the chamber (1) and
 a plasma (28) is created near the substrate to generate reactive carbon atoms, a process characterised in that the plasma is created by applying a direct current (DC) (6) and a radio-frequency (RF) (46) alternating current between the two electrodes. Lastly, the invention also relates to a process of diamond synthesis in a vapour deposition chamber (1) and on a synthesis substrate (5), between two plasma-generating electrodes (4, 5), according to which:
 a carrier gas containing carbon atoms is introduced into the chamber (1) and
 a plasma (28) is created near the substrate to generate reactive carbon atoms, a process characterised in that a magnetic field (51) is applied near the substrate.

The term diamond is used here and later in the description to indicate all the allotropic forms containing the $sp^3$ hybridised carbon, particularly diamond, in all its crystal forms or DLC.

With reference to the first implementation of the invention, the reactive carbon atoms are typically carbon atoms in "activated" form, i.e. radical or ionic. This expression here also refers to carbonaceous molecules in an activated form, i.e. radical or ionic. Compressing the plasma consists of guiding or focusing the reactive plasma species, such as the radicals and the ions produced between the electrodes, in a restricted region between the two electrodes in order to increase their concentration and, therefore, the probability of the reaction shocks between radicals. The increase in the number of shocks also generate UVC, or even infrared photons, which themselves generate additional reactive atoms. The combination of these effects significantly improves the speed of diamond deposition on the substrate.

With reference to the second implementation of the invention, in general, the electrodes between which the plasma is generated are supplied by a source of direct current (DC). This energy source is effective in starting the deposition of diamond. However, when the thickness of the layer formed becomes substantial, for example from 25-30 µm, at the temperature prevailing in the chamber, for example between 300 and 1600° C., the diamond layer becomes an electrical insulator sufficient to significantly reduce the flow of energy between the electrodes and therefore decrease the speed of diamond synthesis.

To compensate for this effect, the applicant proposes the hybridisation of the generation of energy and also proposes to combine the source of direct current (DC) with a current source by radio frequencies (RF) and thus create the plasma by applying direct current and radio-frequency (RF) alternating current between the two electrodes.

The direct current (DC) source can be continuous or broken.

The DC/RF ratio can be adjusted during synthesis, particularly according to the thickness of the diamond that is already synthesised, so that the speed of diamond deposition remains constant.

It has also been found, unexpectedly, that the DC/RF ratio affects the crystal structure of the diamond formed: single-crystals, poly-crystals of variable and adjustable sizes.

With reference to the third implementation of the invention, to homogenise the distribution of the reactive carbon atoms in the plasma, it is possible to apply a magnetic field near the substrate. Instead of following a direct path between the electrodes, the reactive atoms additionally acquire a loop or helical motion. The reactive atoms thus travel a longer path and acquire more speed, increasing the probability of collisions, generating the C—C sp3 hybridisation bonds having the characteristics of diamonds, and therefore increasing the synthesis speed. This also helps to avoid arcs and holes in the formed diamond layer or film.

The application of a magnetic field alone can increase the speed of diamond deposition. However, it can be advantageously combined with the compression of plasma and/or hybridisation of DC/RF energy sources.

It has therefore been demonstrated that the three implementations of the invention process aim to solve the same and unique problem of increasing the speed of synthesis for economic reasons. In other words, the invention of this application is an invention of a problem solved in three different ways and which can, moreover, be combined.

The uniqueness requirements of the invention of the patent application are therefore perfectly fulfilled.

In reality, the applicant does not intend to limit the scope of their application to diamond synthesis. The invention process can benefit any other material that can be synthesised by chemical vapour deposition, such as, for example, Si—Ge type semiconductors from a silicon and germanium-carrier gas, or a carrier gas containing silicon nitrides or oxides. Thus, this invention firstly relates to the processes of claims 1-3.

With regard to diamond, the invention here is not limited to pure diamond, but can also be applied for doping the diamond. For example, the diamond can be doped with boron; a boron-carrier gas such as trimethylborane, boron trichloride or diborane is then introduced into the chamber in addition to the carrier gas containing carbon atoms. Diamond can also be doped with nitrogen; therefore, in addition to the carrier gas containing carbon atoms, a nitrogen-carrier gas such as dinitrogen, ammonia or methyl amine is introduced in the chamber.

For the implementation of the process, the invention also relates to a vapour deposition chamber, equipped with a gas inlet and outlet, and inside which two plasma-generating electrodes are placed that are connected to a direct current (DC) source, characterised in that the means of compressing the plasma are provided between the two electrodes.

According to a particular embodiment, the two electrodes are also connected to a source of radio-frequency (RF) alternating current.

Preferably, the two electrodes should be an anode and a cathode, the cathode forming a substrate for diamond deposition.

It is also possible to provide, in the chamber, the means for generating a magnetic field near the substrate.

The invention is better understood using the following description of the preferred embodiment of the invention, with reference to the attached drawing in which.

Figure 1:
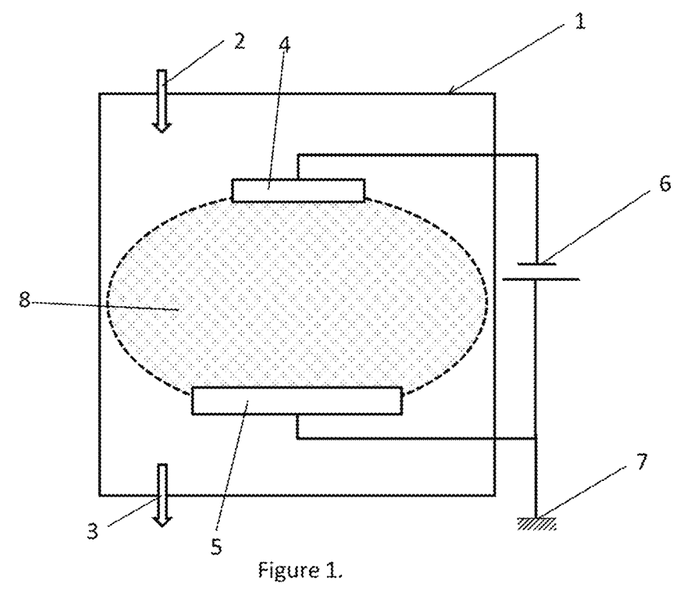
FIG. 1 schematically illustrates a vapour deposition chamber of the prior art.

With reference to FIG. 1, a vapour deposition (CVD) chamber 1 comprises an inlet 2 for gas, an outlet 3 for depressurisation, electrodes, an anode 4 and a substrate 5 forming a cathode, connected to the terminals of a direct current power supply 6, the circuit being connected to the ground 7.

To carry out diamond synthesis, a carrier gas containing carbon atoms, for example methane or ethane, is introduced via inlet 2, the pressure in chamber 1 is reduced by applying vacuum to outlet 3 and a voltage is applied between electrodes 4 and 5. Under the effect of voltage between the electrodes, the molecules of the carrier gas containing carbon atoms are activated to form a plasma in a large volume 8. The volume 8 of plasma extends beyond the area between the electrodes.

The energy applied between the electrodes particularly dissociates certain bonds, such as for example the C—H bonds, thus generating reactive species, such as for example carbon and hydrogen radicals. These radicals can then either re-associate with hydrogen radicals, or with other carbon radicals, thus leading to the formation of a C—C bond; the hydrogen radicals can also associate with each other to form hydrogen gas that can be evacuated from the chamber via outlet 3.

Since the energy of the C—C bond is weaker than that of the C—H bond, the reaction equilibrium is therefore shifted towards the progressive substitution of all the C—H bonds by C—C bonds, i.e. the diamond formation. The larger the C—C bond, the less volatile the species, and the molecules formed are deposited on the substrate under the effect of gravity. The substrate may also contain species that can initiate the formation of C—C bonds on contact. The free radicals are an unstable species with a very long life in a gaseous medium. Although the formation of a molecular bond from the pendant bond of the radical is extremely favourable in terms of energy, it requires a three-body impact in order to allow the conservation of momentum. It is therefore a very rare phenomenon. It is quite different on the surface, a gaseous radical easily associates with a radical centre of the surface, because the phonons can then ensure the conservation of momentum.

Alternatively, a sample tray can be placed on the substrate in order to give specific dimensions to the deposition, or to avoid deposition directly on the electrode.

The probability of collisions between reactive carbon atoms is directly proportional to the volume density of the atoms of these reactive carbon atoms in zone 8 that is linked to the energy applied between the two electrodes 4 and 5.

Figure 2:
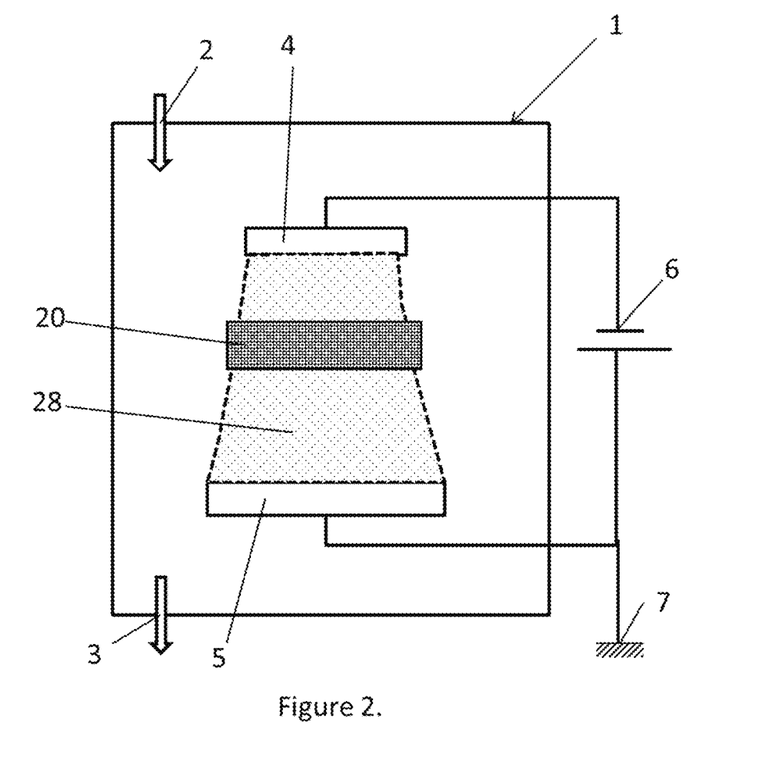
FIG. 2 schematically illustrates a vapour deposition chamber according to one or more embodiments of the present disclosure.
Figure 3:
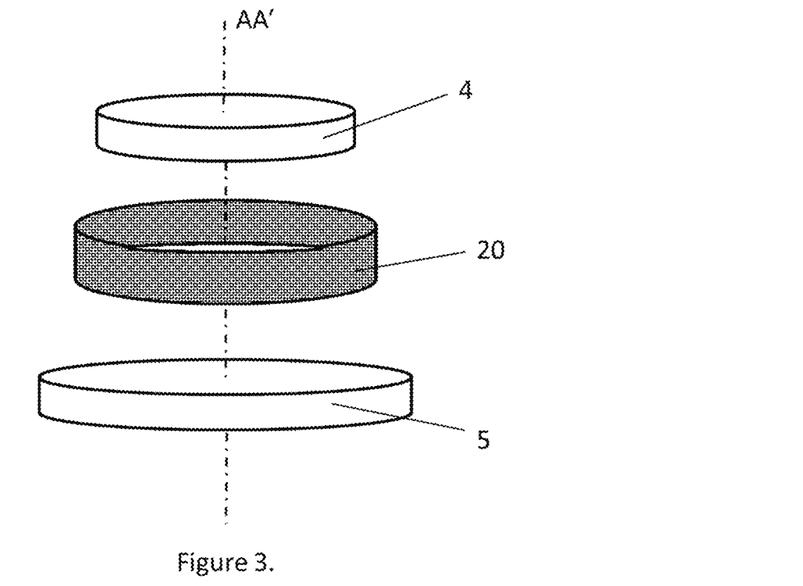
FIG. 3 is a perspective view of the electrodes and grille of FIG. 2.

With reference to FIGS. 2 and 3, where the numbering in FIG. 1 is reused for identical parts, electrodes 4 and 5 here are parallel discs whose centres are placed along an AA' axis. Grille 20, matching the circumference of a cylinder with the AA' axis, is placed in the chamber between electrodes 4 and 5. Grille 20 is connected to a source of direct current.

Electrode 4 could have other forms, such as for example being made up of a single or of a set of points with a spherical end directed along the AA' axis. Electrode 4 can have a concave, convex or flat shape To carry out the synthesis of the diamond, chamber 1 is placed under low pressure (pressure lower than the atmospheric pressure) of the carrier gas containing carbon atoms, by opening gas inlet 2 and applying a negative pressure at outlet 3. A direct current is applied between electrodes 4 and 5, generating a reactive carbon atom plasma between the electrodes. Simultaneously, a direct current is applied to grille 20 in order to create an electric field around the cylinder that it defines, which has the effect of orienting the reactive carbon atoms of the plasma in zone 28 defined between electrodes 4 and 5 and restricted in width by the interior of the cylinder formed by grille 20. Diamond is gradually deposited on substrate 5, in the form of a homogeneous layer. For the same energy applied between electrodes 4 and 5 between the devices of FIGS. 1 and 2, i.e. a priori the same quantity of reactive carbon atoms, the plasma extension zone is reduced in the presence of grille 20, the plasma is compressed, thereby increasing the volume density of the reactive carbon atoms. The probability of collisions between reactive carbon atoms and with the surface is thus increased, which then increases the speed of diamond formation and deposition on the substrate, or alternatively on a sample tray placed on the substrate.

Preferably, the grille should be made of one or more materials having high electronic emissivity. It is advantageous to use refractory materials, such as for example molybdenum or tungsten, to obtain a longer service life of the grille and limit its deformation due to the temperatures it can reach. It is possible to dope these refractory materials, for example with thorium, to increase their electronic emissivity. The peak effect, created on the entire surface of the grille and by each of the constituent parts, converts it into a structure of a large electron-emitting surface.

Grille 20 shown here is a circular section, but any other section can be considered. Particularly, the shape can be chosen according to the shape of the diamond that one wants to obtain. The grille mesh and/or its height can also be changed according to the dimensions and/or characteristics of the chamber, electrodes and/or the chamber. The height of the grille can be the same around the entire circumference of its section or variable, for example in corners, to compensate for electronic effects that would lead to an inhomogeneous diamond deposition.

Likewise, instead of a grille, it is possible to use one or more rings, which may be of the same diameter or of different diameters, and whose centres would be aligned on the AA' axis. It is also possible to use a tube.

The grille, the rings or the tube thus defined are the means of plasma compression whose function is:
- to homogenise the plasma around the substrate or the particular zone where the diamond must be deposited,
- to increase the volume density of reactive carbon atoms in this zone,
- to generate UVC or even IR photons, and possibly emit electrons to provide additional energy and add to the density of plasma.

Since diamond is an electrical insulator, as the layer of diamond deposited on the substrate thickens, it forms a barrier to the direct current passing between electrodes 4 and 5, particularly when the diamond layer becomes 25 to 30 µm thick. Therefore, for the same applied voltage, the volume density of the reactive carbon atoms in the plasma decreases according to the thickness of the diamond layer. The speed of diamond deposition decreases as the thickness of the already formed layer increases.

To be able to form layers thicker than a few tens of microns, the applicant proposes to combine the source of direct current (DC) with a source of current by radiofrequencies (RF) and therefore to create plasma by applying a direct current and a radio-frequency (RF) alternating current.

Figure 4:
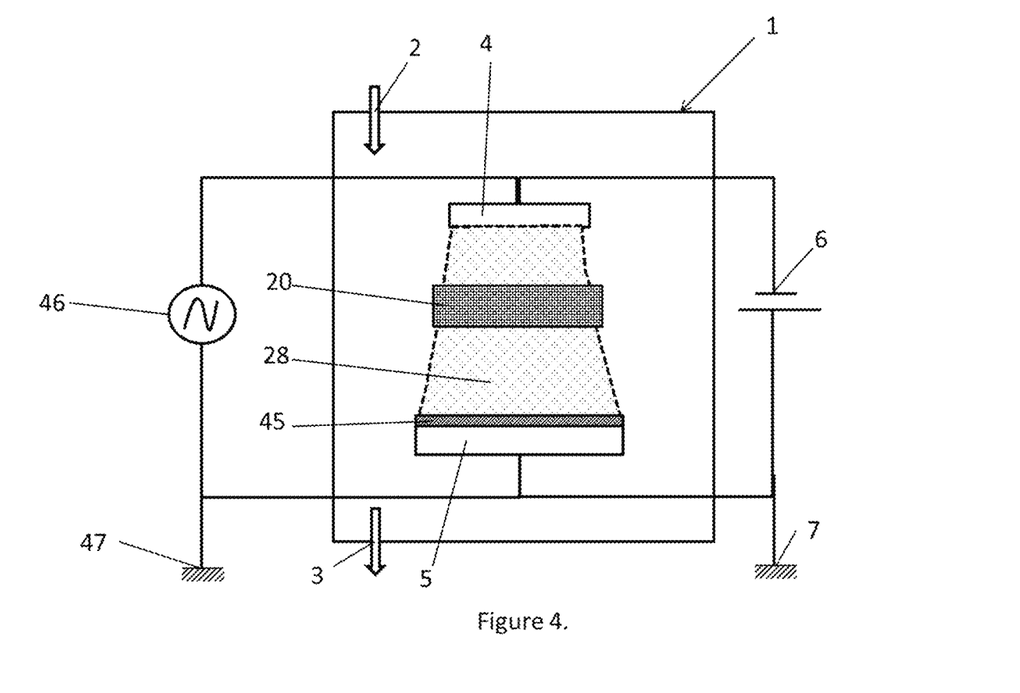
FIG. 4 schematically illustrates a vapour deposition chamber according to one or more embodiments of the present disclosure.

With reference to FIG. 4, using the numbering of the previous figures for common parts, electrodes 4 and 5 are connected to source 46 of a radio-frequency alternating current and to the ground 47, in parallel with the circuit comprising source 6 of direct current.

Source 46 of a radio-frequency alternating current should preferably comprise a filter at its outlet preventing the direct current of source 6 from flowing back into source 46. Source 6 of a direct current should also preferably comprise a filter at its outlet preventing the radio-frequency alternating current of source 46 from flowing back into source 6.

During synthesis, in this configuration, a direct current and a radio-frequency alternating current is applied between electrodes 4 and 5.

The ratio between the two currents, the DC/RF ratio, can be constant during synthesis. It has been observed, unexpectedly, that the DC/RF ratio affects the crystal form of the diamond deposited on the substrate. For example, in a configuration enabling the formation of ultra-nanocrystals of diamond on a substrate with the application of a DC current only, the application of a RF current in an RF/DC power ratio of 0.05 to 0.3 helps in obtaining a deposition formed by larger crystals, i.e. sub-micrometre-sized crystals of several tens of microns.

The ratio between the two currents, the DC/RF ratio can be varied during synthesis, in order to optimise the synthesis speed. For example, the RF current can gradually take over from the direct current as the layer of the deposited diamond thickens. The DC/RF ratio could, for example, also be selected according to the properties desired for the deposition.

The hybrid power supply system for plasma-generating electrodes thus improves the speed of diamond deposition, by compensating for the electrical insulating effect of the diamond that is already deposited. It also enables to change the characteristics such as the structure and properties of the deposition.

The RF current source can also be connected to grille 20, in parallel with the direct current source. These sources can be the same as those supplying the electrodes, or can be separate sources. Each of these sources can alternatively be connected via a power regulator in order to regulate the DC/RF power ratio supplied to the grille. This facilitates the emission of electrons from the grille.

In order to homogenise the distribution of positive and negative charges in the plasma, a magnetic field can be applied to the plasma, preferably near the substrate. This makes it possible to reduce or even prevent the presence of holes in the diamond layer/film that is formed.

Alternatively, or in addition, it is also possible to place a magnet near anode 4.

Figure 5:
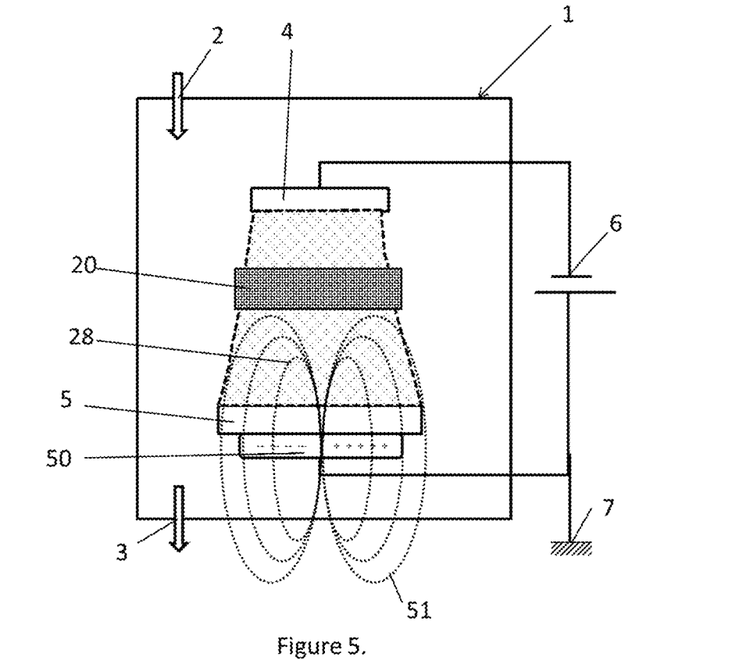
FIG. 5 schematically illustrates a vapour deposition chamber according to one or more embodiments of the present disclosure.

With reference to FIG. 5, using the numbering of the previous figures for common parts, a permanent magnet 50 generating a magnetic field 51 represented by dotted lines, is placed under the substrate electrode 5. The magnet (or electromagnet) is chosen or placed to be able to maximise the radial or longitudinal component or both the components of the magnetic field. Electrodes 4 and 5 illustrated here are only supplied by direct current. It is possible to combine the direct current with a RF current here too.

A single magnet is shown here under substrate 5, but it could also be placed near anode 4. There could also be several magnets, particularly one near substrate 5 and one near anode 4.

During synthesis, the charged atoms of plasma 28, moving between the electrodes under the effect of the electric field created between anode 4 and cathode 5, are additionally subjected to magnetic field 51, near substrate 5. Their path is thus deviated under the action of the Lorentz force, the effect of the two fields adding up on each charged/reactive atom: the charged atoms will then tend to follow a helical path, longer than the one in the presence of a single field, forming loops around the magnetic field lines. The addition of the effects of the two fields will also accelerate the movement of the reactive atoms.

The reactive atoms travelling faster over a longer path then have a higher probability of collision, which results in an increase in the concentration of activated carbons and finally an increase in the speed of diamond formation and deposition on the substrate. A permanent magnet has been described here, but any form of magnet, permanent or not, generating an appropriate magnetic field near the substrate can be used.

The distance between the anode and the substrate/cathode can be adjusted to optimise the deposition.

Thus, the three elements of the invention: the means of plasma compression, the hybridisation of the current sources and the application of a magnetic field near the substrate, each have, separately, a positive impact on the speed of diamond formation and deposition, linking these three elements by a unique inventive concept. This impact is even stronger than two of these means, when the three means are used in combination, as illustrated in the following example.

As described above, the UVCs generated in situ in the plasma help to improve the efficiency of the reaction by promoting the dissociation of the reagent bonds to form the plasma. It is also possible to apply UVCs near the substrate, where the plasma is formed, in order to achieve the same place effect. UVC lamps can be placed in the chemical vapour deposition chamber.

Similarly, to further improve the efficiency of the synthesis reaction, particularly the specificity of this reaction, the principles described in WO2017121892 can be applied. Particularly, the photons of a particular frequency and/or energies, which correspond to an absorption frequency of the material to be synthesised and/or of a reagent, can be sent to the substrate to improve the speed of material formation.

EXAMPLE

A CVD chamber with a diameter of 260 mm and a height of 160 mm contains a 3.2 mm diameter tungsten anode placed approximately 35 mm above a 15 mm by 15 mm silicon substrate forming the cathode.

In case of using a grille, the grille is made of molybdenum and has a diameter of 5 cm, a height of about 1 cm and a mesh of 1 mm.

In case of using a magnet, a transverse magnetic field of 0.02 T is created by an electromagnet.

When a hybrid DC/RF energy source is used, the two sources are applied here at the same time throughout the duration of the deposition.

The carbon-carrier gas introduced into the chamber consists of a mixture of 3% methane in 97% hydrogen. The pressure is brought to approximately 300 mBar and stabilised in order to ensure the stability of the plasma.

The temperature in the chamber during synthesis is approximately 950° C., which here corresponds to the optimal temperature for deposition on a silicon substrate.

The direct current applied is a direct current of 735 V, with a power of approximately 1200 W (±100 W).

Several diamond depositions were made, with or without a grille, by applying a direct current or a hybrid DC/RF current, with or without a magnet placed under the substrate, for 1 hour. The results are given in the table below:

|  | RF power (±100 W) | Deposition speed (μm/hr) | Nature of the film |
| --- | --- | --- | --- |
| Without grille | — | 7 | Inhomogeneous polycrystalline + grille |
|  | — | 14 | Homogeneous polycrystalline + grille + RF |
|  | 300 W | 44 | Homogeneous polycrystalline + grille + RF + magnetic field |
|  | 300 W | 84 | Homogeneous polycrystalline |

The mere presence of the grille doubles the speed of deposition and homogenises the nature of the film. The combination of the grille and the hybrid DC/RF power source accelerates the deposition speed by more than six times.

The magnetic field applied here prevents the discharges resulting from occasional electric arcs and leading to holes in the diamond deposition and it also almost doubles the speed of deposition.

Similar results have been observed for molybdenum substrates.

The above description describes diamond synthesis. It related to both, pure diamond and diamond doped with, for example, nitrogen atoms, in order to obtain a diamond having particular properties, such as for example the properties of a semiconductor. For this, a suitable gas in an appropriate quantity can be introduced into the deposition chamber.

It has also been observed, unexpectedly, that the nature of the substrate affects the crystal form of the diamond, depending on whether it is, for example, made of silicon, molybdenum, tungsten, titanium or quartz.

Although here the advantage of the process is demonstrated for the synthesis of diamond, the means of plasma compression can be applied to any other type of synthesis by chemical vapour deposition, at atmospheric pressure or at low pressure, in order to improve the speed of deposition. The same applies for the DC/RF hybridisation and/or the application of a magnetic field near the substrate.

The invention claimed is:

1. A chemical vapour deposition chamber defining a volume and having an inlet adapted to enable a gas or a plasma or both a gas and a plasma to enter the chamber, and an outlet adapted to depressurize the chamber, the chamber further comprising:
   at least one anode;
   a substrate forming a cathode;
   a hybrid power supply in a circuit with the anode and cathode, the hybrid power supply comprising a direct current (DC) to the anode and cathode and the hybrid power supply comprising an alternating current source by radiofrequencies (RF); and a magnet disposed near the anode, the magnet being adapted to apply a non-radial magnetic field within the chamber.

2. The chemical vapour deposition chamber of claim 1, wherein the magnet comprises an electromagnet.

3. The chemical vapour deposition chamber of claim 1, wherein the magnet comprises a permanent magnet.

4. The chemical vapour deposition chamber of claim 1, wherein the hybrid power supply is further adapted to enable a ratio between the DC and AC currents, the DC/AC ratio adapted to be selectively constant or varied.

5. The chemical vapour deposition chamber of claim 1, further comprising a grille connected with the RF current source and connected in parallel with the direct current source.

6. The chemical vapour deposition chamber of claim 1, wherein the magnet comprises at least one permanent magnet that is adapted to generate a non-radial magnetic field between the anode and the cathode.

7. A chemical vapour deposition chamber defining a volume and having an inlet adapted to enable a gas or a plasma or both a gas and a plasma to enter the chamber, and an outlet adapted to depressurize the chamber, the chamber further comprising:
at least one anode;
a substrate forming a cathode;
a hybrid power supply in a circuit with the anode and cathode, the hybrid power supply comprising a direct current (DC) to the anode and cathode and the hybrid power supply comprising a source of current by radiofrequencies enabled to operate in an alternating (RF) current; and
a cylinder-shaped grille comprising at least one ring or tube of refractory material which increases the volume density of activated atoms near the substrate and therefore the deposition speed of the material to be synthesised and is further suitable for homogenizing the plasma around the substrate.

8. The chemical vapour deposition chamber of claim 7, further comprising a magnet being adapted to apply a non-radial magnetic field within the chamber.

9. The chemical vapour deposition chamber of claim 7, wherein the hybrid power supply is further adapted to enable a ratio between the DC and AC currents, the DC/AC ratio adapted to be selectively constant or varied.

10. The chemical vapour deposition chamber of claim 7, further comprising a grille connected with the alternating current source and connected in parallel with the direct current source.

11. The chemical vapour deposition chamber of claim 7, wherein the magnet comprises at least one permanent magnet that is adapted to generate a linear magnetic field.

12. A method of chemical vapour deposition comprising:
providing a vapour deposition chamber defining a volume and having an inlet and an outlet wherein the chamber further comprises at least one anode, a substrate forming a cathode, a hybrid power supply in a circuit with the anode and cathode, the hybrid power supply comprising a direct current (DC) to the anode and cathode and the hybrid power supply comprising a source of current by radiofrequencies enabled to operate in an alternating (RF) current;
providing a negative pressure to the chamber;
introducing a carrier gas containing carbon atoms into the chamber; and
creating a plasma near the substrate to generate reactive carbon atoms, wherein the plasma is created by applying a direct current and a radio-frequency alternating current between the cathode and the anode; and
providing the chamber with at least one magnet being adapted to apply a linear magnetic field within the chamber; and
applying the linear magnetic field near the substrate.

13. The method of claim 12, further comprising:
providing the chamber with a grille forming a cylinder between the electrodes; and
simultaneously applying a direct current to the grille and to the anode and cathode to create an electric field which has the effect of orienting the reactive carbon atoms of the plasma in a zone defined between the cathode and anode and restricted by the grille.

14. The method of claim 12, further comprising:
selectively applying either a constant RF/DC ratio or varying the RF/DC ratio.

15. The method of claim 12, further comprising:
providing the chamber with at least one permanent magnet being adapted to apply a non-radial magnetic field within the chamber; and
applying a non-radial magnetic field near the substrate;
providing the chamber with a grille; and
simultaneously applying a direct current to the grille and to the anode and cathode to create an electric field which has the effect of orienting the reactive carbon atoms of the plasma in a zone defined between the cathode and anode and restricted by the grille; and
selectively applying either a constant RF/DC ratio or varying the RF/DC ratio.

16. A method for synthesising an allotropic form of carbon material in a chemical vapour deposition chamber and on a synthesis substrate, between two plasma-generating electrodes, according to which the method comprising:
providing a vapour deposition chamber defining a volume and having an inlet and an outlet wherein the chamber further comprises at least one anode, a substrate forming a cathode, a hybrid power supply in a circuit with the anode and cathode, the hybrid power supply comprising a source of direct current (DC) to the anode and cathode and the hybrid power supply comprising a source of current by radiofrequencies enabled to operate in an alternating (RF) current;
introducing a carrier gas containing atoms of the material to be synthesised into the chamber, and
generating a plasma near the substrate to activate the atoms of the carrier gas containing atoms of the material to be synthesised,
compressing plasma by providing cylinder-shaped grille comprising at least one ring or tube of refractory material which increases the volume density of activated atoms near the substrate and therefore the deposition speed of the material to be synthesised and is further suitable for homogenizing the plasma around the substrate.

17. The method of claim 16, further comprising:
providing an anode and a cathode wherein the cathode is a substrate for diamond deposition.

18. The method of claim 16, further comprising applying a direct current (DC) and a radio-frequency (RF) alternating current between the two electrodes.

19. The method of claim 16, further comprising providing a magnet disposed near the anode and applying a non-radial magnetic field within the chamber.

20. The method of claim 16, further comprising:
applying a direct current (DC) and a radio-frequency (RF) alternating current between the two electrodes; and
providing a magnet disposed near the anode and applying a non-radial magnetic field within the chamber.

* * * * *